(12) United States Patent
Shannon et al.

(10) Patent No.: US 7,554,334 B2
(45) Date of Patent: Jun. 30, 2009

(54) MATCHING NETWORK CHARACTERIZATION USING VARIABLE IMPEDANCE ANALYSIS

(75) Inventors: Steven C. Shannon, San Mateo, CA (US); Daniel J. Hoffman, Saratoga, CA (US); Steven Lane, San Jose, CA (US); Walter R. Merry, Sunnyvale, CA (US); Jivko Dinev, Cupertino, CA (US)

(73) Assignee: Applied Marterials, Inc., Santa Clara, CA (US)

( * ) Notice: Subject to any disclaimer, the term of this patent is extended or adjusted under 35 U.S.C. 154(b) by 251 days.

(21) Appl. No.: 11/536,197

(22) Filed: Sep. 28, 2006

(65) Prior Publication Data
US 2008/0087381 A1 Apr. 17, 2008

(51) Int. Cl.
*G01R 31/02* (2006.01)
(52) U.S. Cl. .................... 324/535; 324/600; 333/32
(58) Field of Classification Search ............ 324/525, 324/600; 333/32
See application file for complete search history.

(56) References Cited

U.S. PATENT DOCUMENTS

| 3,919,644 | A | * | 11/1975 | Smolka ............... 455/123 |
| 4,755,345 | A | * | 7/1988 | Baity et al. ............. 376/123 |
| 5,407,524 | A | * | 4/1995 | Patrick et al. ............ 216/59 |
| 5,952,896 | A | * | 9/1999 | Mett et al. ............... 333/32 |
| 2005/0270118 | A1 | * | 12/2005 | Shannon ................. 333/32 |

FOREIGN PATENT DOCUMENTS

JP 62 054172 A 3/1987

OTHER PUBLICATIONS

Aeloiza, E. C. et al, "A Real Time Method to Estimate Electrolytic Capacitor Condition in PWM Adjustable Speed Drives and Uninterruptible Power Supplies," Power Electronics Specialists, 2005 IEEE, Jun. 12, 2005, pp. 2867-2872, XP010883694.
Yoon, N. S. et al., "A Theoretical Formula of E-H Discharge Transition Power in a Transformer-Coupled Discharge," IEEE Transactions on Plasma Science, vol. 26, No. 2, Apr. 1998, XP011044983.
Engemann, J. and Walter, M., "Modelling of microwave plasma sources: potential and applications," Plasma Phys. Control. Fusion, vol. 41, 1999, pp. B259-B272, XP002463018, Jun. 1999.
Venet, P. et al., "Realization of a Smart Electrolytic Capacitor Circuit," IEEE Industry Applications Magazine, 2002, pp. 16-20, XP002463017, Jan./Feb. 2002.
Amorese, Gregory L., "Minimizing equivalent series resistance measurement errors," Microelectronics Reliability, vol. 42, 2002, pp. 855-860, XP002463019, Feb. 2002.

* cited by examiner

*Primary Examiner*—Vincent Q Nguyen
(74) *Attorney, Agent, or Firm*—Moser IP Law Group

(57) ABSTRACT

Embodiments of a method of calculating the equivalent series resistance of a matching network using variable impedance analysis and matching networks analyzed using the same are provided herein. In one embodiment, a method of calculating the equivalent series resistance of a matching network includes the steps of connecting the matching network to a load; measuring an output of the matching network over a range of load impedances; and calculating the equivalent series resistance of the matching network based upon a relationship between the measured output and the load resistance. The load may be a surrogate load or may be a plasma formed in a process chamber.

19 Claims, 2 Drawing Sheets

MATCHING NETWORK CHARACTERIZATION USING VARIABLE IMPEDANCE ANALYSIS

BACKGROUND OF THE INVENTION

1. Field of the Invention

Embodiments of the invention generally relate to matching networks for semiconductor processing systems. More specifically, embodiments of the present invention relate to characterization of matching networks.

2. Description of the Related Art

In plasma-enhanced semiconductor processing systems, such as etch or deposition processing systems, radio frequency (RF) matching networks are used to couple RF power from an RF source having a substantially resistive impedance (e.g., 50 ohms) to a load, which is generally a processing plasma in a process chamber, which has a complex impedance. The matching network operates to match the RF source's impedance to the plasma/load's impedance to efficiently couple the RF power from the source to the plasma.

One type of matching network that is widely used in semiconductor wafer processing systems is a tunable matching network, wherein a series connected frequency-dependent passive element and a shunt connected frequency-dependent passive element are dynamically tuned to achieve an impedance match between the source and the load. One such tunable matching network is disclosed in commonly assigned U.S. Pat. No. 5,952,896, which issued on Sep. 14, 1999 and describes a matching network having a series connected inductor and a shunt connected capacitor. A matching network controller mechanically tunes or adjusts the shunt position of the capacitor and the inductor to achieve an impedance match between the source impedance and the load impedance. More particularly, as the load impedance changes, actuators continually adjust the tunable elements of the inductor and capacitor in the matching network to maintain the impedance match.

In a tunable matching network, the matching network terminates into a non-dissipating load (generally a capacitive element), which allows the matching network to tune and measure current. In this situation, when the power is known and current is accurate, $R_{MW}=P_{in}/I^2$. However, drawbacks to this computational method include: a) only one match set point can be tested; b) the matching network typically cannot tune to a zero resistance load condition, which results in a mismatch condition that reduces the accuracy of the power measurement (and therefore increases the inaccuracy of the resistance calculation); and c) the matching network requires an accurate measurement of RF current at the match output for proper operation, which is not provided by conventional configurations.

Additionally, conventional matching networks typically introduce purely reactive elements in series with a 50Ω terminated load to move the total impedance of the load into the matching network's operative tuning range. In this configuration, all of the power is dissipated in the 50Ω load, which allows for a more accurate measurement at that particular point. If the matching network has a resistance that is also very close to 50Ω (or close to the terminated load resistance), the power loss through the matching network can be accurately measured using two power meters. If the impedance of the termination load is known, this can be converted into an equivalent series resistance for the match. However, building a complex, purely reactive load is very difficult. Therefore, unaccounted for losses in the surrogate load will overestimate the power dissipation in the matching network, resulting in higher than actual resistance approximations for conventional matching networks of this configuration.

Therefore, there is a need for a matching network analysis technique that allows for improved approximation of an equivalent series resistance of matching networks.

SUMMARY OF THE INVENTION

Embodiments of a method of calculating the equivalent series resistance of a matching network using variable impedance analysis and matching networks analyzed using the same are provided herein. In one embodiment, a method of calculating the equivalent series resistance of a matching network includes the steps of connecting the matching network to a load; measuring an output of the matching network over a range of load impedances; and calculating the equivalent series resistance of the matching network based upon a relationship between the measured output and the load resistance. The load may be a surrogate load or may be a plasma formed in a process chamber.

In another embodiment, a method for characterizing a matching network includes the steps of connecting the matching network to a variable impedance surrogate load; measuring an output of the matching network over a range of load impedances; calculating the equivalent series resistance of the matching network based upon a relationship between the measured output and the load resistance; and evaluating the condition of the matching network based upon the calculated effective resistance.

BRIEF DESCRIPTION OF THE DRAWINGS

So that the manner in which the above recited features of the present invention can be understood in detail, a more particular description of the invention, briefly summarized above, may be had by reference to embodiments thereof, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a matching network analysis technique that operates to accurately approximate an equivalent series resistance (ESR) for the matching network through a series of matching network output extrapolations at various load resistances. The approximation of the ESR of the matching network allows for approximation of the matching network loss (also referred to as the insertion loss of the matching network) due to the series resistance at all points within the match tune space. The present invention also generally provides for matching networks characterized by methods in accordance with the present invention.

Figure 1:
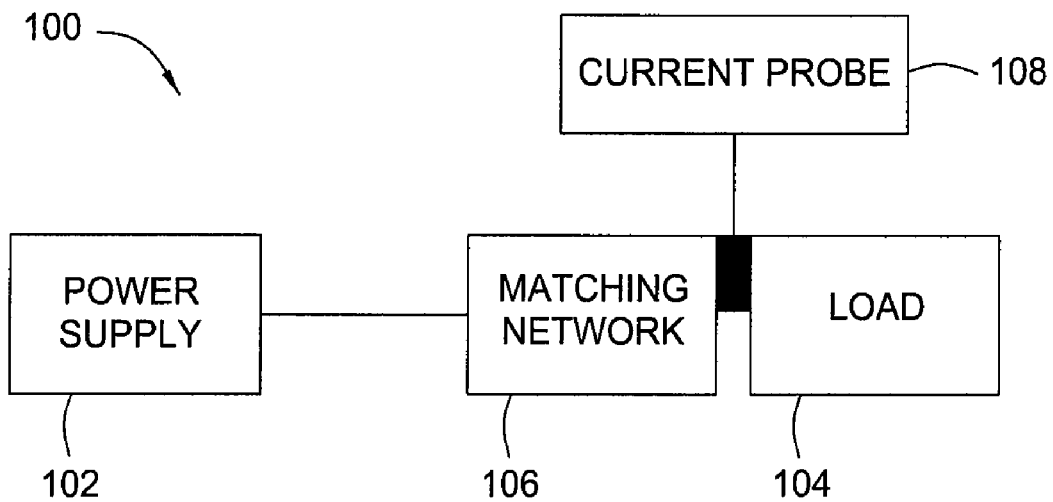
FIG. 1 illustrates a general block diagram of one embodiment of a system suitable for use with the method of the present invention.

FIG. 1 illustrates a general block diagram of a system 100 suitable for characterizing a matching network in accordance with embodiments of the present invention. The system 100 generally includes a power supply 102 in communication with a load 104 through a matching network 106. A probe 108 is generally provided for measuring current or some other metric proportional to current at the output of the matching network 106.

The power supply 102 is generally one or more RF power sources, such as an RF source capable of producing a signal having a power of about 10-10,000 Watts and a frequency of from about 200 kHz to about 200 MHz. In one embodiment, the power supply 102 is an RF source capable of producing a signal having a power in the range of about 10-5,000 Watts and a frequency of about 13.56 MHz. In another embodiment, the power supply 102 is a multi-frequency RF source (or multiple RF sources) capable of producing signals having a power in the range of about 10-5,000 Watts and at, for example, a first frequency of about 2 MHz and a second frequency of about 13 MHz; a first frequency of about 2 MHz and a second frequency of about 60 MHz; a first frequency of about 13 MHz and a second frequency of about 60 MHz; and a first frequency of about 2 MHz, a second frequency of about 13 MHz, and a third frequency of about 60 MHz. The previous frequency combinations are given for illustration only and it is contemplated that other single and multiple frequency combinations may be utilized in combination with the present invention.

Alternatively, the power supply 102 may be a signal generator or network analyzer for generating a low power signal to be fed into the match/load. In one embodiment, the power supply 102 is configured to produce a signal having a power level that does not dissipate enough power to impact match performance. In one embodiment, the power supply 102 is capable of producing a signal having a power in the range of about 0.1 milliwatts to about 10 Watts, thereby advantageously minimizing heating of the internal components of the matching network.

The load 104 may be a plasma formed in a plasma enhanced semiconductor process chamber, or may be a simulated load (such as a variable impedance surrogate load). For example, in one embodiment, the load 104 may be created by providing a gas to the interior of a semiconductor process chamber (not shown) at a suitable temperature and pressure, and coupling sufficient RF power from the power supply 102, for example at a frequency of 13.56 MHz, to an electrode disposed within the process chamber to form a plasma. The plasma generated by the power supply 102 is the load that the power supply 102 sees from a circuit standpoint. Alternatively, the load 104 may be provided by coupling the power supply 102 (and matching network 106) to a circuit that provides a load (for example, a variable impedance surrogate load) to simulate a plasma within a process chamber. The surrogate load may be suitably designed to operate within the power requirements of the power supply 102. Accordingly, the load 104 may be capable of handling power in the range of about 10-5,000 Watts. Alternatively, the load 104 may be designed to operate with a low power power supply 102 as discussed above (i.e., capable handling power in the range of about 0.1 milliwatts to about 10 Wafts), thereby advantageously facilitating making the load 104 portable for field testing, ease of transport or storage, and the like.

In an ideally efficient system, 100 percent of the power supplied by the power supply 102 would be dissipated by the load 104, e.g., a plasma in a semiconductor process chamber. However, several factors exist that reduce the efficiency of the system. For example, reflected power from the load 104 reduces the net power dissipated by the load 104. Accordingly, a matching network, such as matching network 106, is typically disposed between the power supply 102 and the load 104 to match the impedance between the power supply and the load, and thereby minimize the reflected power and maximize the efficient usage of the power supply 102 (e.g., maximizing the amount of power dissipated by the load as compared to the actual power delivered by the power source 102).

The matching network 106 generally includes a circuit configured to transmit power from the power supply 102 to the load 104 in a manner that minimizes reflected power from the load 104, thereby maximizing efficient usage of the power supply 102. The matching network 106 typically minimizes the reflected power through adjustable components, such as capacitors, in the matching network that operate to adjust the impedance of the matching network so that the power reflected from the load is minimized (sometimes referred to as 'tuning' the matching network). Some matching networks may alternatively or additionally be tuned via adjustment of the frequency of the signal provided by the power supply 102.

In addition to losses due to reflected power, transmission inefficiencies within the processing system results in additional power dissipation within the cables and components disposed between the power supply 102 and the load 104, including the matching network 106. Therefore, in addition to the ability of the matching network 106 to minimize reflected power from the load 104 to the power supply 102, the matching network 106 should also dissipate as little power as possible to facilitate efficient operation of a processing system having the matching network inserted therein. Accordingly, accurate measurement of the ESR of the matching network 106 facilitates many process advantages, such as more accurate control of process parameters, more accurate knowledge of power dissipated by load, and the like.

Additionally, accurate measurement of the ESR of the matching network 106 enables matching network operational checkups over the life of the matching network to ensure proper performance, matching network pairing for multiple systems, matching network quality control (to reject unfit networks and/or to separate into groups having different efficiencies), matching network comparison and evaluation (e.g., evaluating matches from various vendors), and the like. Also, accurate measurement of the ESR of the matching network 106 facilitates scaling power in processes when hardware has been swapped so that changes in power loss in the match can be accounted for (e.g., if a match with an ESR=x fails and is replaced with a match having an ESR=1.1x, the power can be scaled accordingly so that the dissipated power in the plasma is matched). Also, higher power runs can be conducted to measure the effect of dissipated power on the losses in the match. For example, as temperature goes up, metal conductivity goes down, so ESR of the matching network goes up, thereby causing more power to be dissipated in the match and further causing the temperature of the matching network components to increase, and so on.

Figure 2:
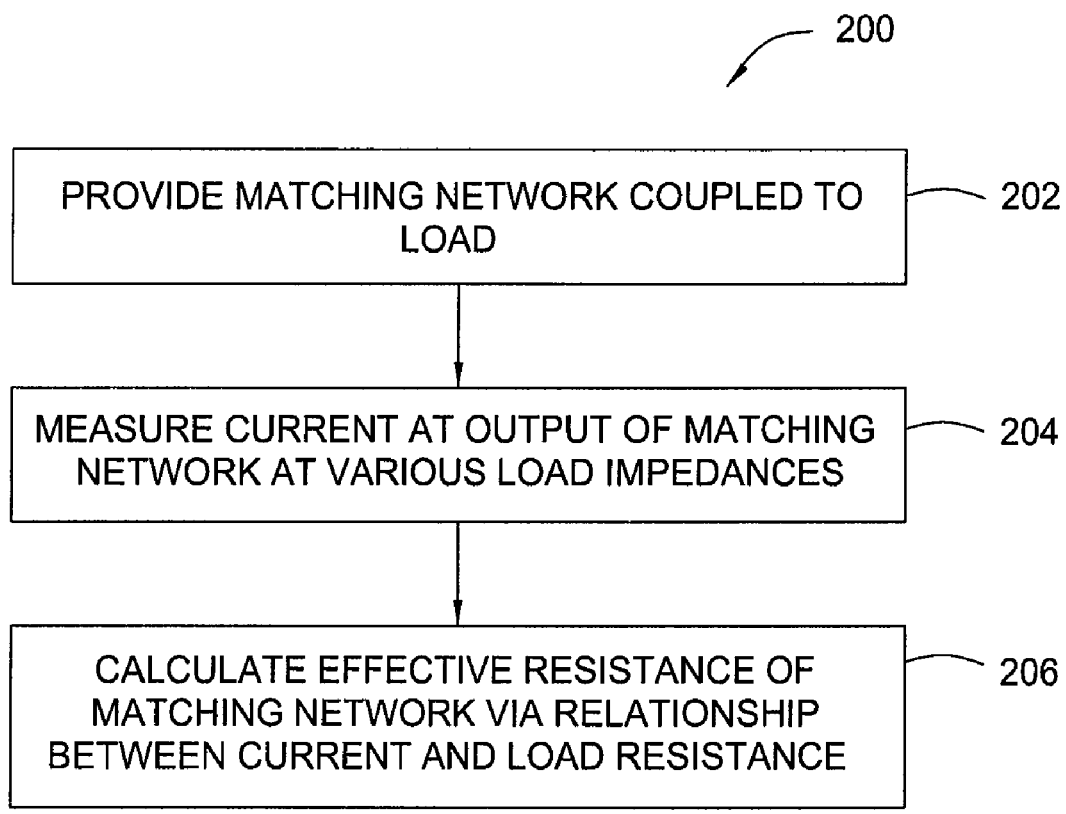
FIG. 2 illustrates a method in accordance with one embodiment of the present invention.

To facilitate the characterization of the insertion loss of a matching network, a method is provided for determining the ESR of the matching network. FIG. 2 depicts one embodiment of a method 200 for determining the ESR of a matching network. The method 200 begins at step 202, where a power supply is coupled to a load through a matching network. The matching network may be any matching network suitable for matching the impedance of a load to a power supply, such as, for example, a matching network used in connection with a plasma enhanced semiconductor process chamber. In one embodiment, the matching network may be a variable shunt, frequency tuned matching network as described above with reference to FIG. 1. As also discussed above, the load is a tunable load and may be a process chamber having a plasma formed therein or a surrogate load, such as a variable impedance surrogate load. The frequency of the signal provided by the power supply should be at the drive frequency that the matching network typically runs at. However, other frequencies in a similar band may similarly used, and the ESR at the drive frequency can be calculated using known relationships between dissipative losses and frequency (e.g., skin effect, and the like). The matching network is typically adjusted to minimize the reflected power from the load.

Next, at step 204, the current at the output of the matching network is measured over a range of load impedances. The range of load impedances may be selected to reflect a range of load impedances expected to by produced by the load during operation in a particular process or number of processes. Optionally, the range may further be extended by a desired amount. Alternatively, the load impedances may be selected to be any desired range. The current may be measured at preselected intervals over the range of impedances. Generally, the number of measurements may be selected to produce a satisfactory fit of the current measurements to a first, second, or third order polynomial. For example, in one embodiment, the current may be measured in 5 to 10 percent increments throughout the range.

During step 204, the load is set at a first impedance either by appropriately configuring the variable impedance surrogate load or by controlling the process parameters of the process chamber to cause the plasma formed therein to have a desired impedance (For example, by altering a process parameter that affects the impedance of the plasma, such as chamber pressure, process gas selection, RF power, additional power sources not being characterized, and the like). The current may then be measured at the output of the matching network via a probe 108 as depicted in FIG. 1. Alternatively or in combination, other metrics proportional to the current may be measured rather than measuring the current, such as the signal measured from a B-loop probe, Regalski coil, Pearson coil, slotted antenna, or the like. The load is then set to the next impedance and the measurements taken for that load impedance. This is repeated until the desired matching network output has been measured at all desired load impedances.

Next, at step 206, the ESR of the matching network is calculated using the collected data. In one embodiment, the ESR ($R_{MW}$) of the matching network is calculated using a relationship between the measured current and the resistance of the load ($R_{Load}$). Specifically, $R_{MW}$ may be calculated through a linear regression of the relationship between $1/I_2$ and $R_{Load}$. This relationship may be determined as follows.

The combination of the matching network and the load provides a characteristic termination for the power supply connection (typically 50Ω). The power dissipated by the matching network and the load can generally be broken up into two components, as illustrated by equation (1), wherein $P_{TOTAL}$ is the total power, $P_{MW}$ is the power dissipated by the matching network, and $P_{Load}$ is the power dissipated by the load.

$$P_{TOTAL} = P_{MW} + P_{Load} \quad (1)$$

The total power dissipated is related to the dissipative components of each element ($R_{MW}$ and $R_{LOAD}$) and the current through the network ($I_{MW}$ and $I_{LOAD}$) as represented by equation (2).

$$P_{TOTAL} = I_{MW}^2 \cdot R_{MW} + I_{LOAD}^2 \cdot R_{LOAD} \quad (2)$$

As the matching network and the load are connected in series, the current through both components is identical and may be represented simply as I. Therefore, the total power dissipated may be represented by equation (3).

$$P_{TOTAL} = I^2 \cdot (R_{MW} + R_{LOAD}) \quad (3)$$

Rearranging equation (3), the resistive components may be placed on one side of the equation, as illustrated in equation (4).

$$P_{TOTAL} / I^2 = R_{MW} + R_{LOAD} \quad (4)$$

Any linear inaccuracy of the current measurement can also be accounted for by multiplying the current by an unknown constant, k, as illustrated in equation (5).

$$P_{TOTAL} / k^2 \cdot I^2 = R_{MW} + R_{LOAD} \quad (5)$$

With this relationship established, plotting the relationship between $R_{LOAD}$ and $1/I^2$ yields a linear relationship with a slope and an intercept as illustrated in equations (6) and (7).

$$\text{Slope} = k^2 / P_{TOTAL} \quad (6)$$

$$\text{Intercept} = k^2 \cdot R_{MW} / P_{TOTAL} \quad (7)$$

Therefore, according to equations (6) and (7), the ratio of the intercept to the slope is $R_{MW}$. These equations show that the accuracy of the measurement of the matching network output is not a factor in the characterization, as it cancels out of the equations when the ratio of the intercept to the slope is obtained from equations (6) and (7). The only general requirements of this embodiment is that the signal linearly respond to actual RF current at the match output (see the current probe 108 illustrated in FIG. 1) and that zero RF current yield a zero signal. Thus, the ESR of the matching network may be accurately measured to more accurately approximate the efficiency of the matching network, i.e., the percent of power dissipated in the RF delivery system as compared to the load, where the power is meant to be dissipated.

Embodiments of the method as described above are applicable even in instances where the relationship between the current and the resistance of the load is non-linear. For example, the relationship may be parabolic or along some other curve. In an instance where the relationship is non-linear, matching network output measurements may be taken at desired points along the range of load impedances sufficient to fit the data to a curve (for example a second or third order polynomial) with a high degree of certainty. Once the equation for the curve is determined, the first derivative of that equation will yield the slope at a given point on the curve, thereby approximating the linear relationship derived above. The ESR of the matching network may then be calculated as described above. Alternatively, linear regression analysis may be performed on desired regions of the curve or on the raw data to determine a best fit.

Figure 3:
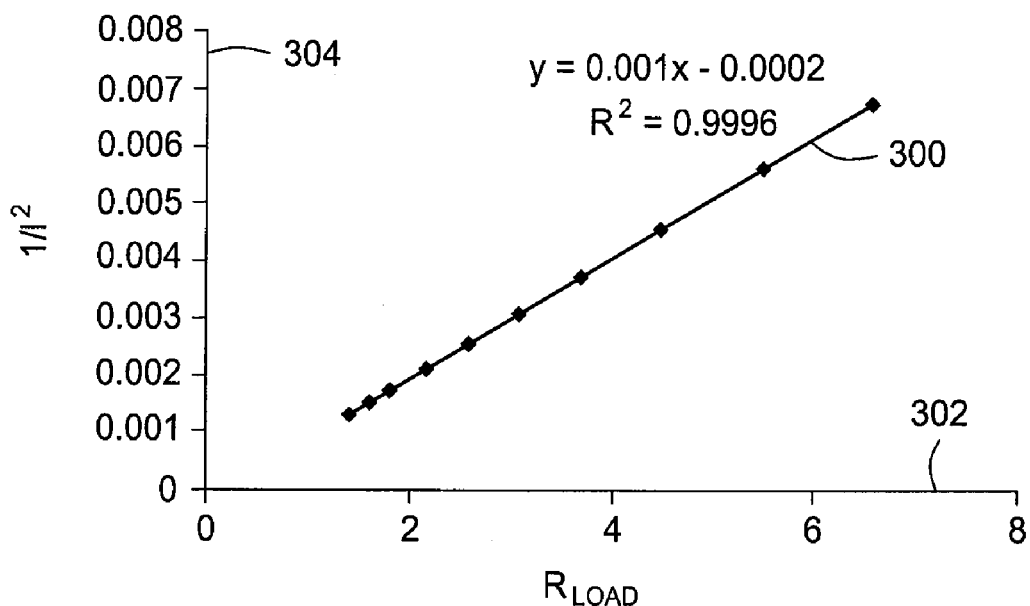
FIG. 3 illustrates an exemplary plot of data acquired using one method of the present invention.

FIG. 3 depicts an exemplary plot of data acquired using one method of the present invention. Applying the method of the invention to an exemplary matching network, a data plot 300 of $R_{LOAD}$ (axis 302) verses the inverse of $I^2$ (axis 304) was generated, as shown in FIG. 3. The equation of the line connecting the data points was determined to be as shown in equation (8).

$$y = 0.001x - 0.0002 \quad (8)$$

This line was fit with a high degree of certainty (an $R^2$ value of 0.9996 using a least squares regression for the particular run). Using the above noted equations the ESR of the matching network ($R_{MW}$) was determined in this case to be 164 mΩ.

In addition, the polarity of the ESR offset may further be determined based upon how the load impedance is measured.

For example, if the ESR offset is measured using the matching network's impedance at a matched condition and assuming that the load is the complex conjugate of that impedance with the match input terminated to the characteristic impedance of the power delivery system (typically 50 Ohms), then you will get a negative ESR because it needs to be subtracted from the impedance measured. If the ESR offset measurement is taken at the load, then the ESR will be positive, because it will need to be added to the network to provide the ideal match. Thus, both measurement approaches may be performed to provide a measure of the accuracy of the measurement as well as an ESR range.

Figure 4:
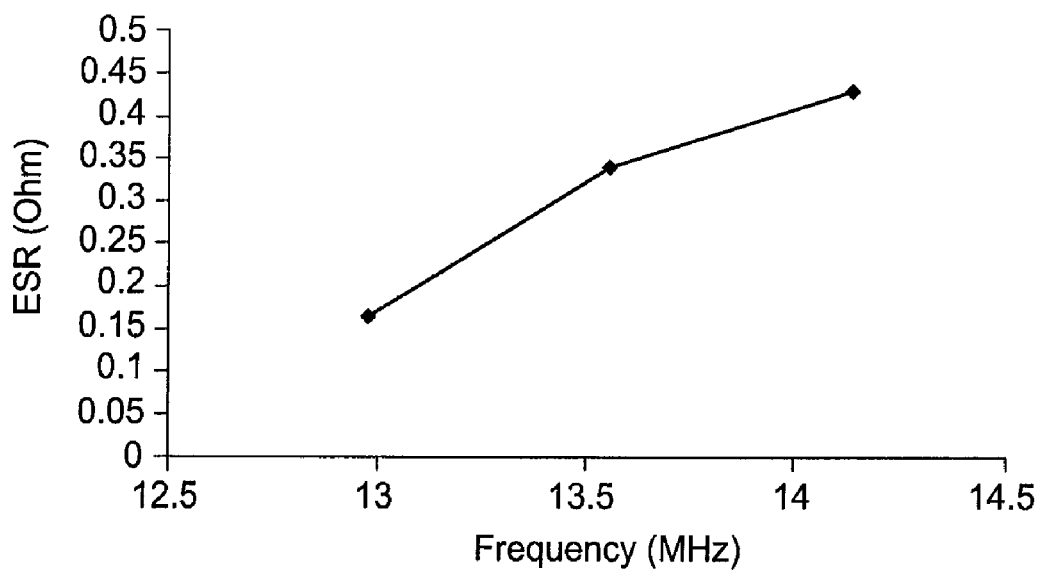
FIG. 4 illustrates an exemplary plot of equivalent series resistance verses frequency for a variable shunt, frequency tuned matching network.

A further benefit of the above-described measurement method of the invention is the capability to estimate the ESR (ESR) at any tune point of the matching network. The importance of this benefit is demonstrated in the plot of FIG. 4, which outlines the significant change in ESR with respect to frequency for a variable shunt, frequency tuned matching network. The plot of FIG. 4 clearly illustrates that ESR changes with respect to shunt element variation (the element that is typically used to dial in the real portion of the load impedance so as to achieve the 50Ω load resistance) can be approximated by first order by looking at any departure from the expected linear response during the $1/I^2$ versus $R_{LOAD}$ analysis. If any significant non-linearity is observed, a smaller $R_{LOAD}$ range, centered at the load impedance for that particular match condition, can provide an approximation of $R_{MW}$ at that point and allow for a two dimensional map across match tune space. For example, any observed non-linearity can be approximated by reducing the range of real impedance over which the data is acquired, such that a piece-wise linear approximation of the non-linear response can thereby be established.

In another embodiment of the invention, a characterization method of the invention may be used to test a matching network before the circuit is installed in the processing system. More particularly, the characterization method of the invention may be used to determine if manufactured matching network circuits are within a predetermined set of tolerances specified for a particular plasma processing operation. Alternatively or in combination, matching networks may be compared an grouped into units having the same or similar (i.e., within a predetermined tolerance) effective resistance, thereby facilitating matching of units (for chambers having multiple matching networks, for multiple processing systems for a given customer, and the like), setting different price points for more or less efficient units, and the like.

In another embodiment, a matching network coupled to a semiconductor processing chamber may be tested to facilitate trouble-shooting the matching network. For example, process parameters within the process chamber may be varied to change the impedance of a plasma load within the chamber, such as by altering RF power, frequency, chamber pressure, and the like. The current at the output of the matching network is measured as a function of the process parameter being changed. The tuning component positions of the matching network (e.g., variable capacitor positions, variable inductor positions, frequency of power source signal, and the like) are also recorded as a function of the process parameter being changed. The matching network may then be disconnected from the process chamber and the complex conjugate of the matching network impedance may be measured with the matching network input terminated to 50Ω with the matching network in the same tuned condition as when connected to the process chamber. Next, the current and the impedance measurements obtained at the same match conditions may be analyzed as described above to obtain the ESR of the matching network. Alternatively, the impedance of the load may be measured directly. Once the ESR of the matching network is obtained, the measurements may be compared to previous measurements (such as a baseline ESR reading done during manufacturing or some other prior time), or to a predetermined standard (such as a quality specification).

Thus, methods for characterizing the insertion loss for a matching network over a range of impedances have been provided herein, providing substantial unrecognized benefits over conventional matching network analysis techniques. For example, the accuracy of the RF measurement does not impact the accuracy of the ESR approximation in the method of the invention. Any linear inaccuracy between the actual RF current measured and the actual RF current cancels out in this analysis, which is not possible with conventional matching network analysis techniques. Further, with the method of the invention, match loss is determined across all points within the matching network tune space, and not just at a single point setting, as with conventional characterization techniques. The ability to characterize across an entire matching network tune space is important, as match insertion loss often depends heavily upon series and shunt tuning conditions, and therefore, the ability to characterize across the entire tune space eliminates this challenge associated with conventional matching network characterization. Further still, power measurements are generally made at a 50Ω termination impedance, which provides an increased level of power measurement accuracy as compared to the mismatched conditions that are used in conventional loss approximation methods.

While the inventors have described a plurality of embodiments herein, the invention is not intended to be limited to any particular embodiment. Rather, the inventors contemplate that any combination, in whole or in part, of the above described embodiments may be implemented in the present invention without departing from the true scope of the invention. Therefore, while the foregoing is directed to embodiments of the invention, additional and further embodiments of the invention may be devised without departing from the basic scope thereof, as determined by the following claims.

The invention claimed is:

1. A method for characterizing a matching network, comprising:
   connecting the matching network to a load;
   measuring an output of the matching network over a range of load impedances to obtain a plurality of measured outputs; and
   calculating the equivalent series resistance of the matching network based upon a relationship between the plurality of measured outputs and a corresponding plurality of load resistance resistances over the range of load impedances.

2. The method of claim 1, wherein the load is a variable impedance surrogate load.

3. The method of claim 2, wherein the surrogate load comprises a tunable circuit capable of generating a desired range of impedances.

4. The method of claim 1, wherein the load is a plasma formed in a process chamber.

5. The method of claim 4, further comprising:
   varying the impedance of the plasma by selectively controlling parameters of the process chamber.

6. The method of claim 5, wherein the selectively controlled parameters comprise at least one of temperature, power, frequency, resistance, or pressure.

7. The method of claim 5, further comprising:
   determining whether the matching network needs repair or replacement by comparing the calculated equivalent series resistance of the matching network to a previously determined range of acceptable equivalent series resistance values.

8. The method of claim 1, further comprising:
evaluating the condition of the matching network based upon the calculated effective resistance.

9. The method of claim 1, wherein the step of calculating the equivalent series resistance further comprises:
generating a linear regression plot of the plurality of matching network measured outputs versus the corresponding plurality of load resistance.

10. The method of claim 1, wherein the step of calculating the equivalent series resistance further comprises:
determining a polynomial expression describing the plurality of matching network measured outputs as a function of the corresponding plurality of load resistance.

11. The method of claim 1, wherein each measured output of the matching network is current.

12. The method of claim 1, wherein each measured output of the matching network is a metric proportional to current.

13. The method of claim 1, wherein the range of load impedances spans across a tuning space for the matching network.

14. A method for characterizing a matching network, comprising:
connecting the matching network to a variable impedance surrogate load;
measuring an output of the matching network over a range of load impedances to obtain a plurality of measured outputs;
calculating the equivalent series resistance of the matching network based upon a relationship between the plurality of measured outputs and a corresponding plurality of load resistances over the range of load impedances; and
evaluating the condition of the matching network based upon the calculated effective resistance.

15. The method of claim 14, wherein the calculating step further comprises:
generating a linear regression plot of the plurality of matching network measured outputs versus the corresponding plurality of load resistances.

16. The method of claim 14, wherein the step of calculating the equivalent series resistance further comprises:
determining a polynomial expression describing the plurality of matching network measured outputs as a function of the corresponding plurality load resistance.

17. The method of claim 14, wherein each matching network measured output is current or a metric proportional to current.

18. The method of claim 14, wherein the evaluating step further comprises:
comparing the calculated equivalent series resistance to a predetermined acceptable resistance level.

19. The method of claim 18, further comprising:
accepting, rejecting, and/or grouping the matching network in response to the comparing step.

* * * * *